United States Patent
Zhong et al.

(10) Patent No.: US 8,443,267 B2
(45) Date of Patent: May 14, 2013

(54) SYSTEMS AND METHODS FOR HARD DECISION ASSISTED DECODING

(75) Inventors: Hao Zhong, San Jose, CA (US);
Shaohua Yang, Santa Clara, CA (US);
Weijun Tan, Longmont, CO (US);
Changyou Xu, Fremont, CA (US); Yuan Xing Lee, San Jose, CA (US)

(73) Assignee: LSI Corporation, San Jose, CA (US)

( * ) Notice: Subject to any disclaimer, the term of this patent is extended or adjusted under 35 U.S.C. 154(b) by 1051 days.

(21) Appl. No.: 12/430,927

(22) Filed: Apr. 28, 2009

(65) Prior Publication Data

US 2010/0275096 A1 Oct. 28, 2010

(51) Int. Cl.
*G06F 11/00* (2006.01)

(52) U.S. Cl.
USPC .......................................... 714/780

(58) Field of Classification Search .................. None
See application file for complete search history.

(56) References Cited

U.S. PATENT DOCUMENTS

| | | | |
|---|---|---|---|
| 5,278,846 A | 1/1994 | Okayama et al. |
| 5,325,402 A | 6/1994 | Ushirokawa |
| 5,392,299 A | 2/1995 | Rhines et al. |
| 5,513,192 A | 4/1996 | Janku et al. |
| 5,612,964 A | 3/1997 | Haraszti |
| 5,701,314 A | 12/1997 | Armstrong et al. |
| 5,717,706 A | 2/1998 | Ikeda |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |
| 6,097,764 A | 8/2000 | McCallister et al. |
| 6,216,251 B1 | 4/2001 | McGinn |

(Continued)

FOREIGN PATENT DOCUMENTS

| WO | WO 2006/016751 | 2/2006 |
|---|---|---|
| WO | WO 2006/091797 | 8/2007 |

OTHER PUBLICATIONS

Casado et al., Multiple-rate low-density parity-check codes with constant blocklength, IEEE Transations on Communications, Jan. 2009, vol. 57, pp. 75-83.

(Continued)

*Primary Examiner* — Christopher McCarthy
(74) *Attorney, Agent, or Firm* — Hamilton DeSanctis & Cha

(57) ABSTRACT

Various embodiments of the present invention provide systems and methods for data processing. For example, a data processing system is disclosed that includes a processing loop circuit having a data detector and a soft decision decoder. The data detector provides a detected output, and the soft decision decoder applies a soft decoding algorithm to a derivative of the detected output to yield a soft decision output and a first hard decision output. The systems further include a queuing buffer and a hard decision decoder. The queuing buffer is operable to store the soft decision output, and the hard decision decoder accesses the soft decision output and applies a hard decoding algorithm to yield a second hard decision output. The data detector is operable to perform a data detection on a derivative of the soft decision output if the soft decision decoder and the hard decision decoder fail to converge.

24 Claims, 5 Drawing Sheets

U.S. PATENT DOCUMENTS

| | | |
|---|---|---|
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,438,717 B1 | 8/2002 | Butler et al. |
| 6,473,878 B1 | 10/2002 | Wei |
| 6,526,538 B1 * | 2/2003 | Hewitt ............................ 714/780 |
| 6,625,775 B1 | 9/2003 | Kim |
| 6,671,404 B1 | 12/2003 | Kawatani et al. |
| 6,748,034 B2 | 6/2004 | Hattori et al. |
| 6,757,862 B1 | 6/2004 | Marianetti, II |
| 6,788,654 B1 | 9/2004 | Hashimoto et al. |
| 6,810,502 B2 | 10/2004 | Eidson et al. |
| 6,986,098 B2 | 1/2006 | Poeppelman et al. |
| 7,010,051 B2 | 3/2006 | Murayama et al. |
| 7,047,474 B2 | 5/2006 | Rhee et al. |
| 7,058,873 B2 | 6/2006 | Song et al. |
| 7,093,179 B2 | 8/2006 | Shea |
| 7,184,486 B1 | 2/2007 | Wu et al. |
| 7,191,378 B2 | 3/2007 | Eroz et al. |
| 7,203,887 B2 | 4/2007 | Eroz et al. |
| 7,257,764 B2 | 8/2007 | Suzuki et al. |
| 7,310,768 B2 | 12/2007 | Eidson et al. |
| 7,779,325 B2 * | 8/2010 | Song ............................. 714/752 |
| 7,978,793 B2 * | 7/2011 | Anekoji ......................... 375/341 |
| 8,161,357 B2 * | 4/2012 | Tan et al. ...................... 714/780 |
| 8,219,892 B2 * | 7/2012 | Tan et al. ...................... 714/780 |
| 8,250,444 B2 * | 8/2012 | Le Bars et al. ................ 714/780 |
| 2004/0098659 A1 | 5/2004 | Bjerke et al. |
| 2005/0216819 A1 | 9/2005 | Chugg et al. |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0140311 A1 | 6/2006 | Ashley et al. |
| 2006/0168493 A1 | 7/2006 | Song |
| 2006/0195772 A1 | 8/2006 | Graef et al. |
| 2006/0248435 A1 | 11/2006 | Haratsch |
| 2007/0011569 A1 | 1/2007 | Vila Casado et al. |
| 2007/0047635 A1 | 3/2007 | Stojanovic et al. |
| 2007/0071139 A1 * | 3/2007 | Arslan et al. .................. 375/340 |
| 2007/0286270 A1 | 12/2007 | Huang et al. |
| 2008/0049825 A1 | 2/2008 | Chen et al. |
| 2008/0168330 A1 | 7/2008 | Graef et al. |
| 2011/0231738 A1 * | 9/2011 | Horisaki ........................ 714/773 |

OTHER PUBLICATIONS

Collins and Hizlan, "Determinate State Convolutional Codes" IEEE Transactions on Communications, Dec. 1993.

Eleftheriou, E. et al., "Low Density Parity Check Codes for Digital Subscriber Lines", Proc ICC 2002, pp. 1752-1757.

Han and Ryan, "Pinning Techniques for Low-Floor Detection/Decoding of LDPC-Coded Partial Response Channels", 5th International Symposium on Turbo Codes &Related Topics, 2008.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Yeo et al., "VLSI Architecture for Iterative Decoders in Magnetic Storage Channels", Mar. 2001, pp. 748-755, IEEE trans. Magnetics, vol. 37, No. 2.

Zhong et al., "Area-Efficient Min-Sum Decoder VLSI Architecture for High-Rate QC-LDPC Codes in Magnetic Recording", pp. 1-15, Submitted 2006, not yet published.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v.43, pp. 1118-1123, Mar. 20.

Zhong, "VLSI Architecture of LDPC Based Signal Detection and Coding System for Magnetic Recording Channel", Thesis, RPI, Troy, NY, pp. 1-95, May 2006.

Zhong, "Block-LDPC: A Practical LDPC Coding System Design Approach", IEEE Trans. on Circuits, Regular Papers, vol. 5, No. 4, pp. 766-775, Apr. 2005.

* cited by examiner

SYSTEMS AND METHODS FOR HARD DECISION ASSISTED DECODING

BACKGROUND OF THE INVENTION

The present inventions are related to systems and methods for detecting and/or decoding information, and more particularly to systems and methods for performing iterative data decoding and/or detection.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any data losses caused by various factors. In some cases, an encoding/decoding process is used to enhance the ability to detect a data error and to correct such data errors. As an example, a simple data detection and decode may be performed, however, such a simple process often lacks the capability to converge on a corrected data stream.

To heighten the possibility of convergence, various existing processes utilize two or more detection and decode iterations. Turning to FIG. 1, an exemplary prior art two stage data detection and decode circuit 100 is depicted. Two stage data detection and decode circuit 100 receives a data input 105 that is applied to a detector 110. A hard and soft output from detector 110 is provided to an LDPC decoder 115. Input 105 is fed forward via a buffer 130 to another detector 120. Detector 120 uses a soft output of LDPC decider 115 and input 105 to perform an additional data detection process. A hard and soft output from detector 120 is provided to an LDPC decoder 125 that performs a second decoding process and provides an output 135. Where the initial detection and decode provided by detector 110 and LDPC decoder 115 does not converge, the subsequent detection and decode provided by detector 120 and LDPC decoder 125 provide an additional opportunity to converge. Such an approach, however, requires two iterations for each input data set introduced as input 105. This may waste significant power and introduce unnecessary latency where the input is capable of converging in a single iteration. Further, in some cases two iterations is insufficient to result in a convergence. Thus, such an approach is both wasteful in some conditions and insufficient in other conditions.

Hence, for at least the aforementioned reasons, there exists a need in the art for advanced systems and methods for data processing.

BRIEF SUMMARY OF THE INVENTION

The present inventions are related to systems and methods for detecting and/or decoding information, and more particularly to systems and methods for performing iterative data decoding and/or detection.

Various embodiments of the present invention provide data processing systems. The data processing systems include a processing loop circuit having a data detector and a soft decision decoder. The data detector provides a detected output, and the soft decision decoder applies a soft decoding algorithm to a derivative of the detected output to yield a soft decision output and a first hard decision output. The systems further include a queuing buffer and a hard decision decoder. The queuing buffer is operable to store the soft decision output, and the hard decision decoder accesses the soft decision output and applies a hard decoding algorithm to yield a second hard decision output. The data detector is operable to perform a data detection on a derivative of the soft decision output if the soft decision decoder and the hard decision decoder fail to converge. The data detector may be, but is not limited to, a soft output Viterbi algorithm detector, or a maximum a posteriori detector. The soft decision decoder may be, but is not limited to an LDPC decoder performing an LDPC algorithm. As an example, the systems may be implemented as a circuit in, for example, a storage device or a communication device.

Various instances of the aforementioned embodiments further include an output data buffer that stores the first hard decision output whenever the soft decision decoder converges. In some cases, the output data buffer stores the second hard decision output whenever the hard decision decoder converges. In particular cases, the output data buffer is operable to reorder the first hard decision output or the second hard decision output to place them in sequence relative to other hard decision outputs derived from either the soft decision decoder or the hard decision decoder. Such other hard decision outputs are derived from processing other data sets either preceding or succeeding the data set from which the first and/or second hard decision outputs are derived.

In some instances of the aforementioned embodiments, the systems further include an input data buffer that stores a number of input data sets. The data detector applies a data detection algorithm to the input data set using the derivative of the soft decision output. In one or more instances of the aforementioned embodiments, the processing loop circuit further includes an interleaver that interleaves the detected output and provides the result as the derivative of the detected output. In some cases, the processing loop circuit further includes a de-interleaver that de-interleaves the soft decision output and provides the result as the derivative of the soft decision output.

Other embodiments of the present invention provide methods for data processing. The methods include providing a processing loop circuit that includes a data detector and a soft decision decoder. A data input is decoded using the soft decision decoder to yield a soft decision output and a first hard decision output. A hard decision decoder is provided that accesses the first hard decision output and applies a hard decoding algorithm to yield a second hard decision output. The second hard decision output is provided as a result if the second hard decision output converges.

In some instances of the aforementioned embodiments, the soft decision output is a first soft decision output. In such instances, the methods may further include: providing a queuing buffer, and storing the first soft decision output to the queuing buffer. If the hard decision output fails to converge a data detection is performed using the data detector and a derivative of the first soft decision output to yield a detected output, and a derivative of the detected output is decoded using the soft decision decoder to yield a second soft decision output. In some such instances, the methods further include interleaving the detected output to yield an interleaved detected output. In such instances, the derivative of the detected output is the interleaved detected output. In various instances of the aforementioned embodiments, the methods further include de-interleaving the first soft decision output to yield a de-interleaved soft decision output. In such instances, the derivative of the first soft decision output is the de-interleaved soft decision output. In some cases, the methods further include removing first soft decision output from the queuing buffer if the hard decision output converges.

In one or more instances of the aforementioned embodiments, decoding the derivative of the detected output using the soft decision decoder yields a third hard decision output. In such instances, the methods may further include providing the third hard decision output as the result where the third hard decision output converges. In other such instances, the methods may further include writing the second soft decision output to the queuing buffer where the third hard decision output fails to converge.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for detecting and/or decoding information, and more particularly to systems and methods for performing iterative data decoding and/or detection.

Various embodiments of the present invention provide compact hardware solutions for decoding suitable for read channel, wireless transmission and other applications. The decoding circuitry includes a hard decision decoder that performs hard decision decoding on an output from an upstream soft decision decoder. Where processing by the hard decision decoder converges, an output from the hard decision decoder is provided. Otherwise, additional processing by the soft decision decoder may be performed. As a hard decision decoder can be implemented using only a small amount of circuitry and using substantially less power than a corresponding soft decision decoder, use of a hard decision decoder may limit the amount of processing power that is applied to any data set without a significant increase in circuitry. Further, in some cases, hard decision decoding may be done while an non-converged data set sits idle waiting for additional processing by the soft decision decoder. As such, an enhanced possibility of convergence may be achieved without increasing processing latency. In some cases, use of a hard decision decoder in addition to a soft decision decoder may reduce the potential for trapping sets. As such, use of a hard decision decoder may facilitate convergence that may not have been possible using a soft decision decoder under limited numbers of iterations.

Figure 2:
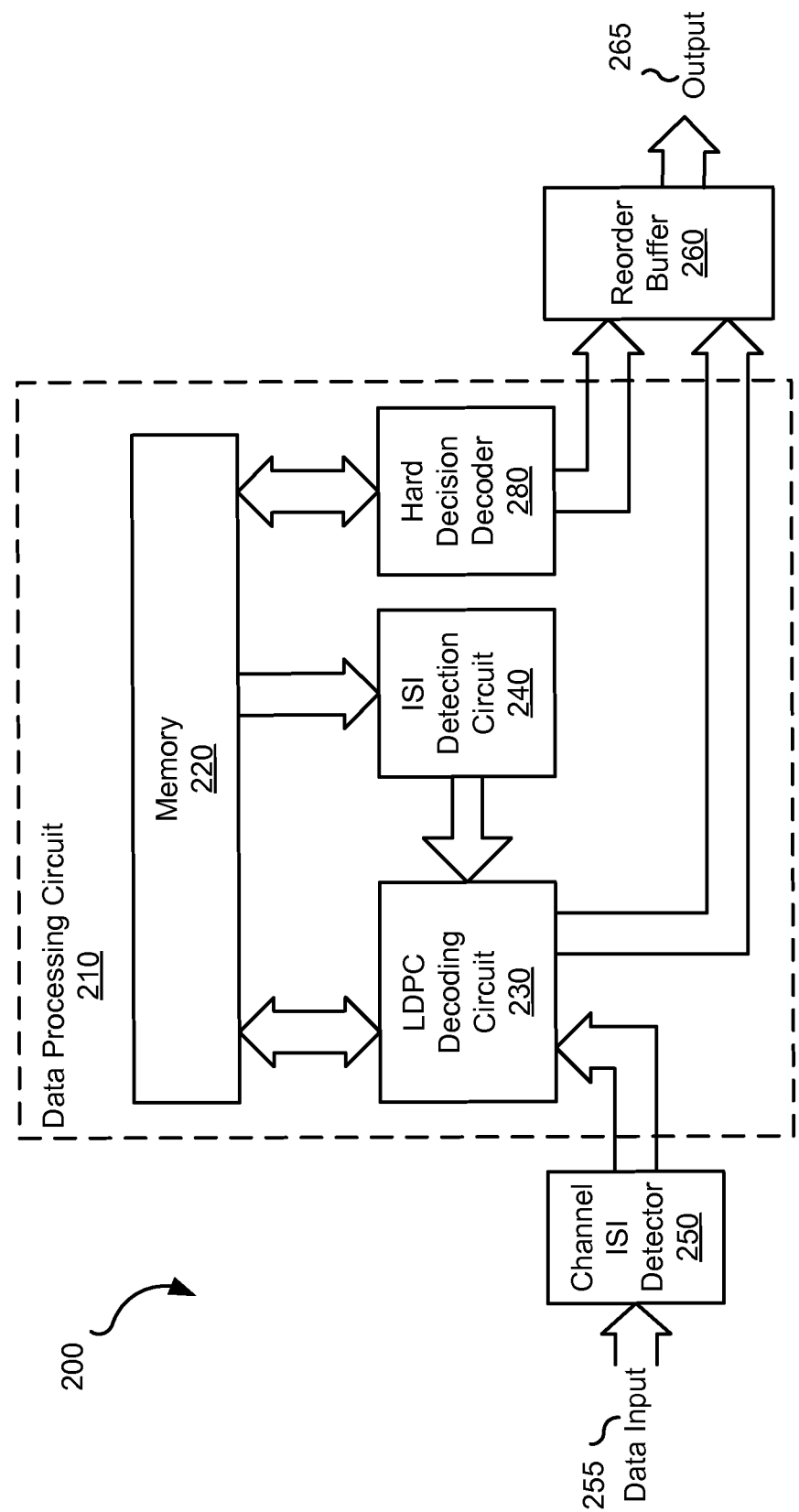
FIG. 2 depicts a data processing codec including hard decision assisted decoding in accordance with one or more embodiments of the present invention.

Turning to FIG. 2, a data processing codec 200 including hard decision assisted decoding is shown in accordance with one or more embodiments of the present invention. Data processing codec 200 includes a data processing circuit 210 with hard decision assist performed by a hard decision decoder 280. Hard decision decoder 280 may be any decoder circuit known in the art that provides a hard decision output. As an example, hard decision decoder 280 may be a parity based decoder as are known in the art. Various examples of hard decision decoders are disclosed in Shu Lin et al. "Error Control Coding", second edition, Prentice Hall 2004 (ISBN No. 0-13-042672-5). The entirety of the aforementioned reference is incorporated herein by reference for all purposes.

Data processing codec 200 receives a data input 255 and provides an output 265. Data input 255 is originally processed by a channel inter-symbol interference detection circuit 250 that provides a processed data set. In some embodiments, data input 255 may be derived from a storage medium. In particular cases, data input 255 is provided as groups of data or data sets that are sometimes referred to as codewords. In the case of a hard disk drive, the received data sets may be sectors of data from the storage medium of the hard disk drive. Based upon the disclosure provided herein, one of ordinary skill in the art will recognize other sources for data input, and other data sets that may be processed in accordance with different embodiments of the present invention.

In addition to hard decision decoder 280, data processing circuit 210 includes an LDPC (i.e., a low density parity check decoder) decoding circuit 230 and an inter-symbol interference detection circuit 240 that are combined such that a number of global iterations of any given data set can be performed. It should be noted that other soft decision data decoders may be used in place of LDPC decoder 230 in different embodiments of the present invention. As used herein, the phrase "soft decision data decoder" is used in its broadest sense to mean any data decoder capable of providing soft decision data. Such soft decision data may be, but is not limited to, log likelihood ratio data. LDPC decoding circuit 230 may be any LDPC decoding circuit known in the art. Further, inter-symbol interference detection circuit 240 may be any detection circuit known in the art. In particular instances, channel inter-symbol interference detection circuit 240 may be identical to channel inter-symbol interference detection circuit 250. Channel inter-symbol interference detection circuit 250 and channel inter-symbol interference detection circuit 240 may be, but are not limited to, soft output Viterbi algorithm detectors (SOVA) or maximum a posteriori (MAP) detectors. Based on the disclosure provided herein, one of ordinary skill in the art will recognize a variety of channel detectors that may be used in accordance with different embodiments of the present invention.

The resulting processed data sets from channel inter-symbol interference detection circuit 250 are provided either directly or indirectly to LDPC decoding circuit 230 where a decoding algorithm is applied to the data set. It is determined whether the decoding process resulted in convergence of the data set. Where the decoding process did result in convergence, the converged data set is provided as a hard decision output to a reorder buffer 260. Once a sequence of data sets are available in reorder buffer 260, the sequence of data sets is provided as an output 265. Reorder buffer 260 provides an ability to apply additional processing iterations to one or more data sets while allowing a succeeding data set to converge after a reduced number of processing iterations.

Where a data set fails to converge after processing by LDPC decoder circuit 230, the non-converged data set is written to a memory 220 where it remains idle until an inter-symbol interference detection circuit 240 becomes available to start re-processing the non-converged data set. While the non-converged data set is idled in memory 220, it is accessed by hard decision decoder 280 that performs a hard decision decoding process on the non-converged data set. Such hard decision decoding includes an ability to detect and correct a defined number of errors in a given data set. As is known in the art, this may be done using parity bits or other information embodied in the data set. Where all of the errors remaining in the non-converged data set are detected and corrected by hard decision decoder 280, the result of the hard decision decoding process is provided to reorder buffer 260 and the data set is removed from memory 220. Again, once a sequence of data sets are available in reorder buffer 260, the sequence of data sets is provided as an output 265.

Otherwise, where hard decision decoder 280 fails to detect and correct all of the errors remaining in the non-converged data set, the data set remains in memory 220. The non-converged data set is ultimately pulled from memory 220 by inter-symbol interference detection circuit 240 that performs a data detection process on the non-converged data set. The data detection process may be any data detection process known in the art, and in some cases may be the identical data detection process originally applied by inter-symbol interference detection circuit 250. The resulting re-processed data set is provided back to LDPC decoding circuit 230 where the decoding algorithm is again applied. In theory, the number of processing iterations (i.e., inter-symbol interference detection and LDPC decoding passes) that may be applied to a given data set is infinite, and processing would continue until convergence is achieved. In practice, however, the number of iterations is limited by the size of reorder buffer 260 and memory 220. Thus, there is some finite limit on the number of processing iterations that may be applied to a given data set. Further, this number of iterations is limited by the convergence or lack of convergence of data sets preceding the given data set.

On each pass of LDPC decoding circuit 230, it is determined whether the data set converged. Where the data set converged, it is written to reorder buffer 260. Where the LDPC processing failed to yield a converged data set, the non-converging data set is written to memory 220. On each writing of a non-converged data set to memory 220, hard decision decoding is applied by hard decision decoder 280 in an effort to resolve any remaining errors. Use of hard decision decoder provides a possibility that a non-converged data set can be resolved without requiring additional global iterations through the combination of LDPC decoder 230 and inter-symbol interference detection circuit 240. As hard decision decoder 280 can be implemented using only a small amount of circuitry and using substantially less power than the combination of LDPC decoder 230 and inter-symbol interference detection circuit 240, overall processing power used in performing data processing by data processing codec 200 may be reduced without a significant increase in circuitry. Further, in some cases, hard decision decoding may be done while an non-converged data set sits idle waiting for inter-symbol interference detection circuit 240 to become free. As such, an enhanced possibility of convergence may be achieved without increasing processing latency. In some cases, use of a hard decision decoder 280 in addition to LDPC decoding circuit 230 may reduce the potential for trapping sets. As such, use of a hard decision decoder may facilitate convergence that may not have been possible using the combination of LDPC decoding circuit 230 and inter-symbol interference detection circuit 240 with limited iterations.

Figure 3:
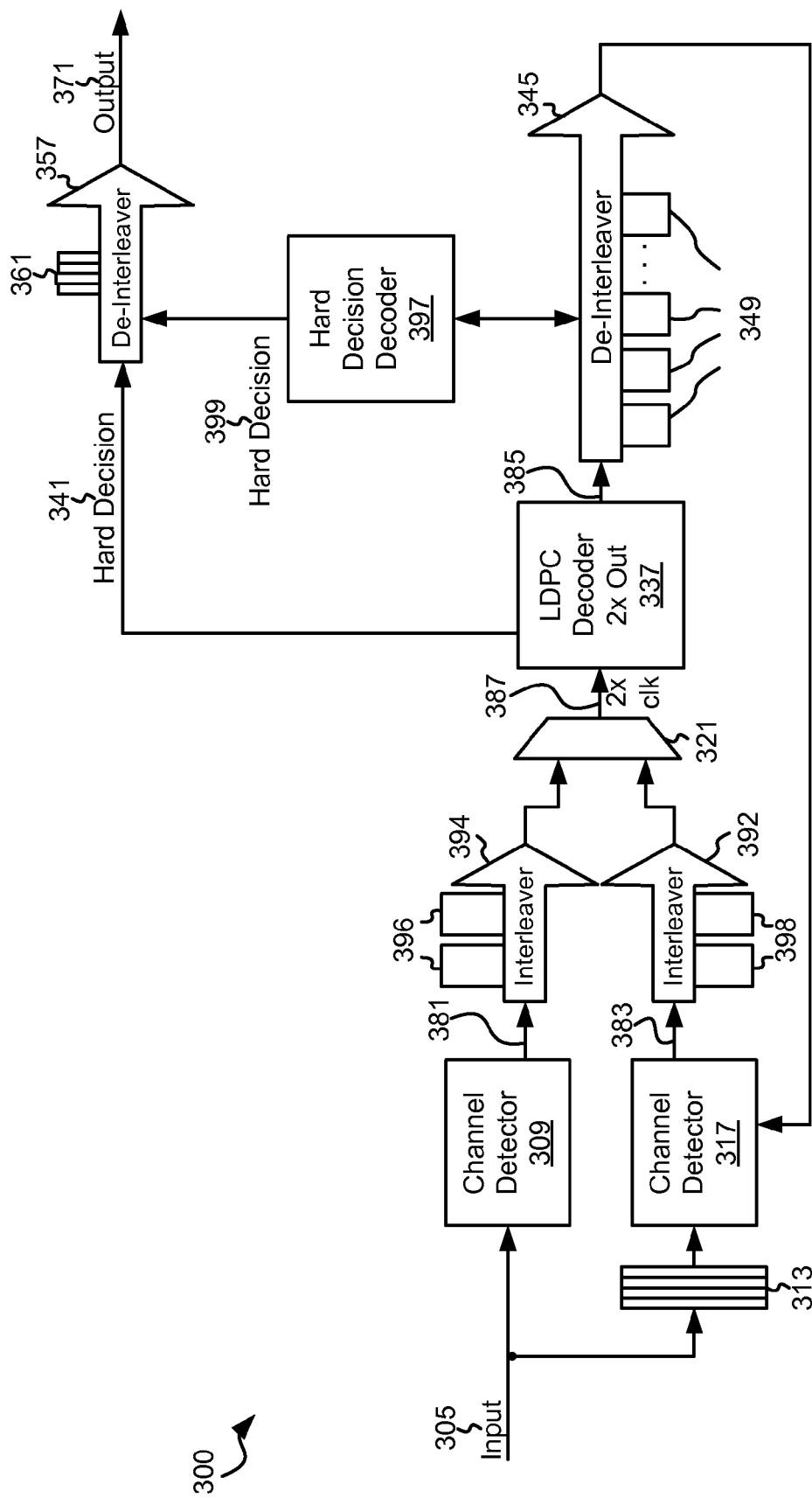
FIG. 3 shows a queuing detection and decoding circuit including hard decision assisted decoding in accordance with various embodiments of the present invention.

Turning to FIG. 3, a queuing detection and decoding circuit 300 including hard decision assisted decoding is shown in accordance with various embodiments of the present invention. Queuing detection and decoding circuit 300 includes a data input 305 that is fed to a channel detector 309. In some embodiments, data input 305 may be derived from a storage medium. In particular cases, data input 305 is provided as groups of data or data sets that are sometimes referred to as codewords. In the case of a hard disk drive, the received data sets may be sectors of data from the storage medium of the hard disk drive. Based upon the disclosure provided herein, one of ordinary skill in the art will recognize other sources for data input, and other data sets that may be processed in accordance with different embodiments of the present invention.

Channel detector 309 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 305 is provided to a memory buffer 313 that is designed to hold a number of data sets received from data input 305. The size of memory buffer 313 may be selected to provide sufficient buffering such that a data set provided via data input 305 remains available at least until a first iteration processing of that same data set is complete and the processed data is available in a queue buffer 349 as more fully described below. Memory buffer 313 provides the data sets to a channel detector 317. Similar to channel detector 309, channel detector 317 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

An output 381 of channel detector 309 is provided to an interleaver circuit 394, and an output 383 of channel detector 317 is provided to another interleaver circuit 392. Interleaver circuit 394 interleaves the output of channel detector 309 using a ping pong buffer 396, and interleaver circuit 392 interleaves the output of channel detector 317 using a ping pong buffer 398. One of the buffers in ping pong buffer 396 holds the result of a prior interleaving process of the output from channel detector 309 and is unloaded to an LDPC decoder 337 via a multiplexer 321, while the other buffer of ping pong buffer 396 holds a data set from channel detector 309 that is currently being interleaved. Similarly, one of the buffers in ping pong buffer 398 holds the result of a prior interleaving process of the output from channel detector 317 and is unloaded to LDPC decoder 337 via a multiplexer 321, while the other buffer of ping pong buffer 398 holds a data set from channel detector 317 that is currently being interleaved. It should be noted that other soft decision data decoders may be used in place of LDPC decoder 337 in different embodiments of the present invention.

LDPC decoder 337 is capable of decoding one or more data sets simultaneously. As an example, LDPC decoder 337 may be designed to decode an interleaved data set from ping pong buffer 396, to decode an interleaved data set from ping pong buffer 398, or to decode interleaved data sets from ping pong buffer 396 and ping pong buffer 398 simultaneously. The decoded data is either provided as a hard decision output 341 or to a de-interleaver circuit 345 that uses queue buffer 349 to de-interleave the decoded data and to store the de-interleaved data until channel detector 317 is available for further processing.

While the non-converging data from LDPC decoder 337 is maintained in queue buffer 349, it is accessed by a hard decision decoder 397. Hard decision decoder 397 operates on interleaved data obtained prior to application of de-interleaving by de-interleaver 345. Hard decision decoder 397 may be any decoder circuit known in the art that provides a hard decision output. As an example, hard decision decoder 397 may be a parity based decoder as are known in the art. Various examples of hard decision decoders are disclosed in Shu Lin et al. "Error Control Coding", second edition, Prentice Hall 2004 (ISBN No. 0-13-042672-5). The entirety of the aforementioned reference has been incorporated herein by reference for all purposes. Hard decision decoder 397 performs a hard decision decoding process that is capable of detecting and correcting a defined number of errors in the non-converging data from LDPC decoder 337. Where the number of errors remaining to be corrected in the non-converging data is within the capability of hard decision decoder 397, the data converges and is provided as a hard decision output 399. In such cases, the corresponding data is removed from queue buffer 349. Where it fails to converge, the data is left in queue buffer 349 until channel detector 317 is available for further processing.

One of the buffers in queue buffer 349 holds the result of a prior de-interleaving process and is unloaded to channel detector 317, while another buffer of queue buffer 349 holds a decoded data set currently being de-interleaved, and one or more other buffers in queue buffer 349 maintain other non-converged data waiting for processing by channel detector 317. Non-converged data from queue buffer 349 is de-interleaved by de-interleaver 345 and passed passed to channel detector 317 that has access to the corresponding data set in memory buffer 313. The data detection performed by channel detector 317 is similar to that performed by channel detector 309. Both hard decision output 341 and hard decision output 399 are provided to a de-interleaver circuit 357 that de-interleaves the received hard decision output 341 or hard decision output 399 and stores the de-interleaved result in one of a number of memory buffers 361. Ultimately, de-interleaver circuit 357 provides the de-interleaved data stored in memory buffers 361 as an output 371.

Queuing detection/decoding circuit 300 allows for performance of a variable number of detection and decoding iterations depending upon the introduced data. Further, in some cases, considerable power savings may be achieved through use of queuing detection/decoding circuit 300. Yet further, in some cases, a faster LDPC decoder may be implemented allowing for an increased throughput where substantial first iteration data convergence exists as multiple iterations are not necessarily required. Yet further, by allowing results of LDPC decoder 337 to be reported out of order, upstream processing does not have to wait for the completion of downstream processing. Re-ordering of the out of order results may be done by queuing detection/decoding circuit 300 or by a downstream recipient of output 371.

By including hard decision decoder 397, there is a possibility that an non-converged data set can be resolved without requiring additional global iterations through the combination of LDPC decoder 337 and channel detector 317. As hard decision decoder 397 can be implemented using only a small amount of circuitry and using substantially less power than the combination of LDPC decoder 337 and channel detector 317, overall processing power used in performing data processing by queuing detection/decoding circuit 300 may be reduced without a significant increase in circuitry. Further, in some cases, hard decision decoding may be done while an non-converged data set sits idle waiting for channel detector 317 to become free. As such, an enhanced possibility of convergence may be achieved without increasing processing latency. In some cases, use of a hard decision decoder in addition to LDPC decoding circuit 337 may reduce the potential for trapping sets. As such, use of a hard decision decoder may facilitate convergence that may not have been possible using the combination of LDPC decoding circuit 337 and channel detector 317 alone.

In operation, a first data set is introduced via data input 304 to channel detector 309. Channel detector 309 performs its channel detection algorithm and provides both a hard output and a soft output to interleaver circuit 394 that interleaves the received data into one buffer of ping pong buffer 396. Interleaver 394 may interleave the data set by writing consecutive data into non-consecutive memory/buffer addresses based on the interleaver algorithm/mapping. Interleaved data is provided from the other buffer of ping pong buffer 396 to LDPC decoder 337 via multiplexer 321. LDPC decoder 337 performs a data decoding process. Where the decoding process converges, LDPC decoder 337 writes its output as hard decision output 341 to output data buffer 361 and the processing is completed for that particular data set. Alternatively, where the data does not converge, LDPC decoder 337 writes its output (both soft and hard) to queue buffer 349. The scheduling guarantees that there is at least one empty buffer for holding this new set of data, and this strategy assures that each data input is guaranteed the possibility of at least two global iterations (i.e., two passes through a detector and decoder pair).

While the non-converging data is maintained in queue buffer 349, it is accessed by hard decision decoder 397 that performs a hard decision decoding process on the hard decision data maintained in a given queue buffer 349. Where the hard decision decoding process resolves the errors remaining in the data set accessed from queue buffer 349, the resolved data set is provided as hard decision 399 and the data set is removed from queue buffer 349. Alternatively, where the hard decision decoding process does not remove the remaining errors, the data set is left in queue buffer 349, and the data is provided from queue buffer 349 to channel detector 317. Channel detector 317 selects the data set that corresponds to the output in queue buffer 349 from input data buffer 313 and performs a subsequent data detection aided by the soft output data generated by LDPC decoder 337 fed back from queue buffer 349. By using the previously generated soft data for data maintained in input data buffer 313, channel detector 317 generally performs a subsequent channel detection with heightened accuracy. The output of this subsequent channel detection is passed to interleaver circuit 392 that interleaves the received data into one buffer of ping pong buffer 398. Interleaver 392 may interleave the data set by writing consecutive data into non-consecutive memory/buffer addresses based on the interleaver algorithm/mapping. Interleaved data is provided from the other buffer of ping pong buffer 398 to LDPC decoder 337 via multiplexer 321. LDPC decoder 337 provides another decoding pass to the data. Similar to the first iteration, a decision is made as to whether the data converged. Where the data converged, LDPC decoder 337 writes its output as hard decision output 341 to output data buffer 361 and the processing is complete for that particular data set. Alternatively, where the data does not converge, LDPC decoder 337 writes its output (both soft and hard) to queue buffer 349 where it is processed using hard decision decoder 397 and passed back to channel detector 317 for another global iteration where such is necessary and possible.

Figure 4:
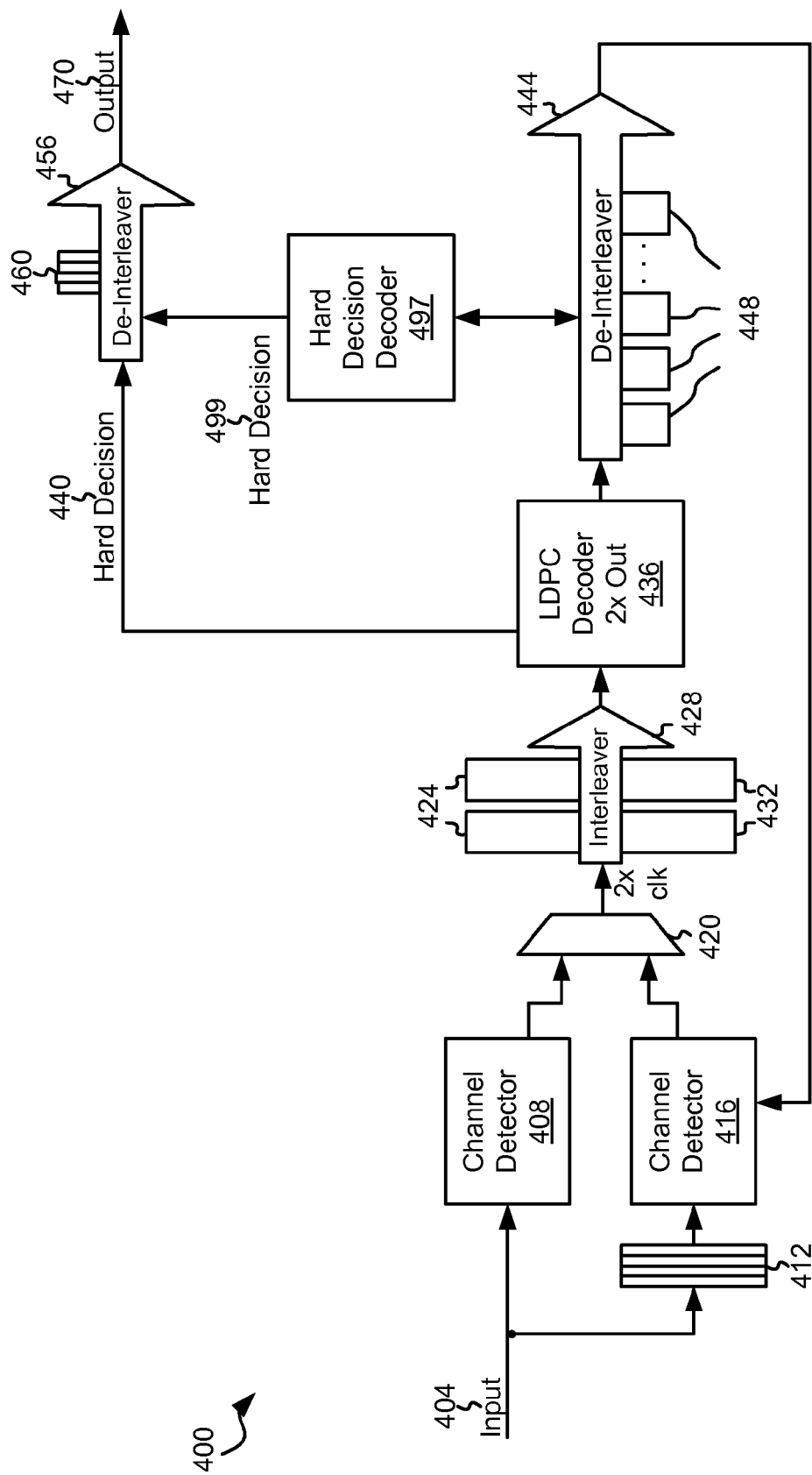
FIG. 4 shows another queuing detection and decoding circuit including hard decision assisted decoding in accordance with other embodiments of the present invention.

Turning to FIG. 4, another queuing detection and decoding circuit 400 including hard decision assisted decoding is shown in accordance with other embodiments of the present invention. Queuing detection/decoding circuit 400 includes a data input 404 that is fed to a channel detector 408. Channel detector 408 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 404 is provided to an input data buffer 412 that is designed to hold a number of data sets received from data input 404. The size of input data buffer 412 may be selected to provide sufficient buffering such that a data set input via data input 404 remains available at least until a first iteration processing of that same data set is complete and the processed data is available in a queue buffer 448 (i.e., a queuing buffer) as more fully described below. Input data buffer 412 provides the data sets to a channel detector 416. Similar to channel detector 408, channel detector 416 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

The output of both channel detector 408 and channel detector 416 are provided to an interleaver circuit 428 via a multiplexer 420. Such outputs may be, for example, log likelihood ratio values. Interleaver circuit 428 interleaves the output of channel detector 408 and separately interleaves the output of channel detector 416 using two ping pong buffers 424, 432. One of the buffers in ping pong buffer 424 holds the result of a prior interleaving process of the output from channel detector 408 and is unloaded to an LDPC decoder 436, while the other buffer of ping pong buffer 424 holds a data set from channel detector 408 that is currently being interleaved. Similarly, one of the buffers in ping pong buffer 432 holds the result of a prior interleaving process of the output from channel detector 416 and is unloaded to LDPC decoder 436, while the other buffer of ping pong buffer 424 holds a data set from channel detector 416 that is currently being interleaved. It should be noted that other soft decision data decoders may be used in place of LDPC decoder 436 in different embodiments of the present invention.

LDPC decoder 436 is capable of decoding one or more data sets simultaneously. As an example, LDPC decoder 436 may be designed to decode an interleaved data set from ping pong buffer 424, or an interleaved data set from ping pong buffer 432, or to decode interleaved data sets from ping pong buffer 424 and ping pong buffer 432 simultaneously. The decoded data is either provided as a hard decision output 440 or to a de-interleaver circuit 444 that uses queue buffer 448 to de-interleave the decoded data and to store the de-interleaved data until channel detector 416 is available for further processing.

While the non-converging data from LDPC decoder 436 is maintained in queue buffer 448, it is accessed by a hard decision decoder 497. Hard decision decoder 497 operates on interleaved data obtained prior to application of de-interleaving by de-interleaver 444. Hard decision decoder 497 may be any decoder circuit known in the art that provides a hard decision output. As an example, hard decision decoder 497 may be a parity based decoder as are known in the art. Various examples of hard decision decoders are disclosed in Shu Lin et al. "Error Control Coding", second edition, Prentice Hall 2004 (ISBN No. 0-13-042672-5). The entirety of the aforementioned reference has been incorporated herein by reference for all purposes. Hard decision decoder 497 performs a hard decision decoding process that is capable of detecting and correcting a defined number of errors in the non-converging data from LDPC decoder 436. Where the number of errors remaining to be corrected in the non-converging data is within the capability of hard decision decoder 497, the data converges and is provided as a hard decision output 499. In such cases, the converging data is removed from queue buffer 448. Where it fails to converge, the data is left in ping pong buffer until channel detector 416 is available for further processing.

One of the buffers in queue buffer 448 holds the result of a prior de-interleaving process and is unloaded to channel detector 416, while another buffer of queue buffer 448 holds a decoded data set currently being de-interleaved, and one or more other buffers in queue buffer 448 maintain other non-converged data waiting for processing by channel detector 416. Non-converged data from queue buffer 448 is de-interleaved by de-interleaver 444 and passed to channel detector 416 that has access to the corresponding data set in memory buffer 412. The data detection performed by channel detector 416 is similar to that performed by channel detector 408. Both hard decision output 440 and hard decision output 499 are provided to a de-interleaver circuit 456 that de-interleaves the received hard decision output 440 or hard decision output 499 and stores the de-interleaved result in one of a number of memory buffers 460. Ultimately, de-interleaver circuit 456 provides the de-interleaved data stored in memory buffers 460 as an output 470.

Queuing detection/decoding circuit 400 operates similar to queuing detection/decoding circuit 300. Thus, queuing detection/decoding circuit 400 allows for performance of a variable number of detection and decoding iterations depending upon the introduced data. Further, in some cases, considerable power savings may be achieved through use of queuing detection/decoding circuit 400. Yet further, in some cases, a faster LDPC decoder may be implemented allowing for an increased throughput where substantial first iteration data convergence exists as multiple iterations are not necessarily required. Yet further, by allowing results of LDPC decoder 436 to be reported out of order, upstream processing does not have to wait for the completion of downstream processing. Re-ordering of the out of order results may be done by queuing detection/decoding circuit 400 or by a downstream recipient of output 470.

By including hard decision decoder 497, there is a possibility that an non-converged data set can be resolved without requiring additional global iterations through the combination of LDPC decoder 436 and channel detector 416. As hard decision decoder 497 can be implemented using only a small amount of circuitry and using substantially less power than the combination of LDPC decoder 436 and channel detector 416, overall processing power used in performing data processing by queuing detection/decoding circuit 400 may be reduced without a significant increase in circuitry. Further, in some cases, hard decision decoding may be done while an non-converged data set sits idle waiting for channel detector 416 to become free. As such, an enhanced possibility of convergence may be achieved without increasing processing latency. In some cases, use of a hard decision decoder in addition to LDPC decoding circuit 436 may reduce the potential for trapping sets. As such, use of a hard decision decoder may facilitate convergence that may not have been possible using the combination of LDPC decoding circuit 436 and channel detector 416 alone.

In operation, a first data set is introduced via data input 404 to channel detector 408. Channel detector 408 performs its channel detection algorithm and provides both a hard output and a soft output to multiplexer 420. The hard and soft decision data is written to one buffer of ping pong buffer 424. At the same time the detector output is written into the buffer, interleaver 428 may interleave the data set by writing consecutive data into non-consecutive memory/buffer addresses based on the interleaver algorithm/mapping. Once interleaver 424 completes its interleaving process, the interleaved data is decoded by LDPC decoder 436. Where the data converges, LDPC decoder 436 writes its output as hard decision output 440 to output data buffer 460 and the processing is completed for that particular data set. Alternatively, where the data does not converge, LDPC decoder 436 writes its output (both soft and hard) to queue buffer 448. The scheduling guarantees that there is at least one empty buffer for holding this new set of data, and this strategy assures that each data input is guaranteed the possibility of at least two global iterations (i.e., two passes through a detector and decoder pair).

While the non-converging data is maintained in queue buffer 448, it is accessed by hard decision decoder 497 that performs a hard decision decoding process. Where the hard decision decoding process resolves any errors remaining in the data set accessed from queue buffer 448, the resolved data set is provided as hard decision 499 and the data set is removed from queue buffer 448. Alternatively, where the hard decision decoding process does not remove any remaining errors, the data set is left in queue buffer 448. This data is provided from queue buffer 448 to channel detector 416. Channel detector 416 selects the data set that corresponds to the output in queue buffer 448 from input data buffer 412 and performs a subsequent data detection aided by the soft output data generated by LDPC decoder 436 fed back from queue buffer 448. By using the previously generated soft data for data maintained in input data buffer 412, channel detector 416 generally performs a subsequent channel detection with heightened accuracy. The output of this subsequent channel detection is passed to interleaver 428 via multiplexer 420. The data is written to one buffer of ping pong buffer 432, and interleaver 428 interleaves the data. The interleaved data is then passed to LDPC decoder 436 where it is decoded a second time. Similar to the first iteration, a decision is made as to whether the data converged or whether there is insufficient space in queue buffer 448 to handle the data. Where such is the case, LDPC decoder 436 writes its output as hard decision output 440 to output data buffer 460 and the processing is complete for that particular data set. Alternatively, where the data does not converge and there is sufficient buffer space in queue buffer 448 to receive an additional data set, writes its output (both soft and hard) to queue buffer 448 where it is passed back to channel detector 416 for a third pass. Sufficient space is defined in queue buffer 448 by having at least reserved space for the data set from the first detector and decoder after the data set from the second detector and decoder is written into the ping pong buffer.

Figure 5:
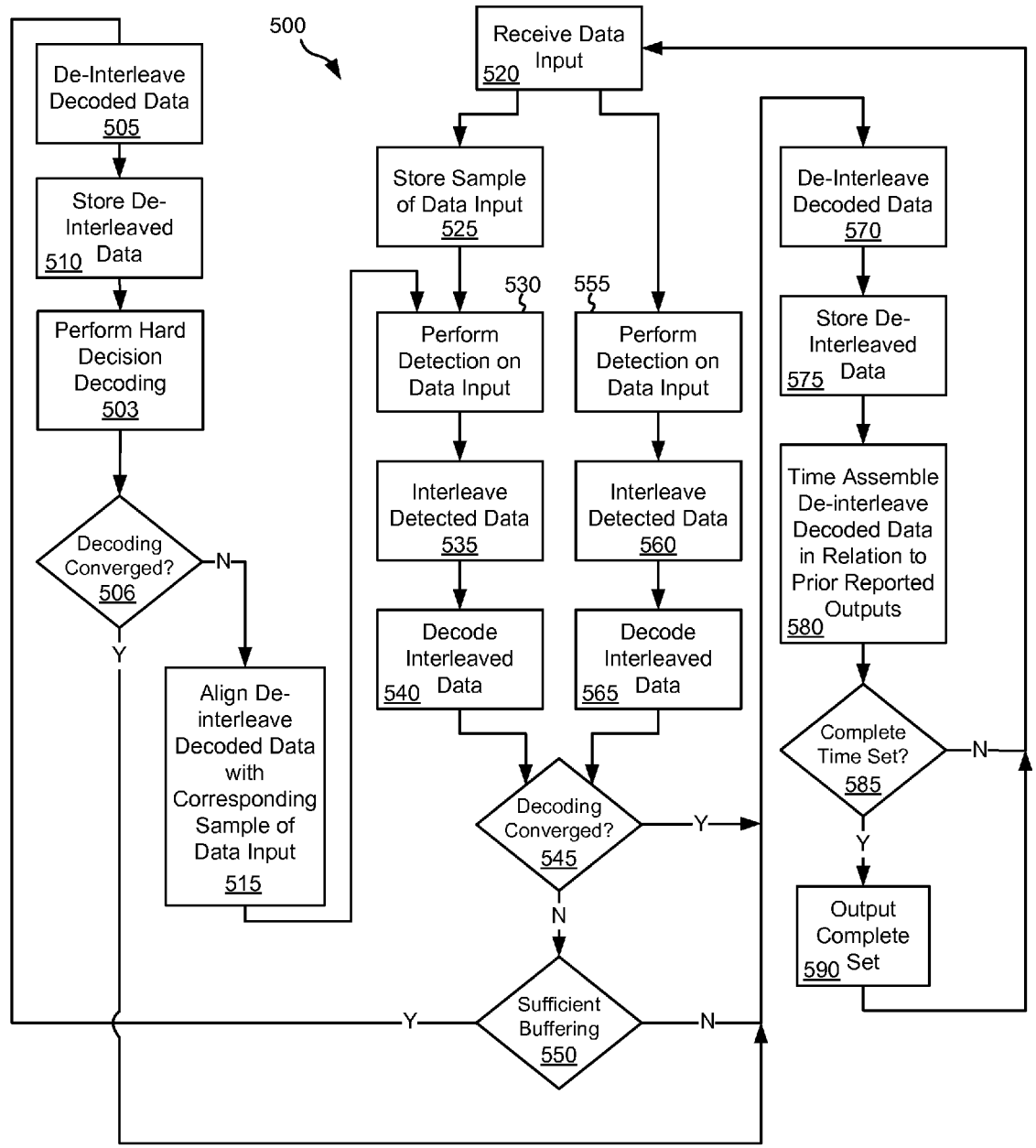
FIG. 5 is a flow diagram showing a method in accordance with some embodiments of the present invention for performing hard decision assisted iterative detection and decoding processes.

Turning to FIG. 5, a flow diagram 500 shows a method in accordance with some embodiments of the present invention for performing hard decision assisted iterative detection and decoding processes. Following flow diagram 500, a data input is received (block 520). This data input may be, but is not limited to, a series of data bits received from a magnetic recording medium or a series of bits received from a transmission channel. Based on the disclosure provided herein, one of ordinary skill in the art will recognize a variety of sources and formats for the received data input. A sample of the received data is stored in a buffer and retained for later processing (block 525). Data detection processes are performed on the received data (block 555), the detected data is interleaved (block 560), and the interleaved data is decoded (block 565). It is then determined whether the decoding process converged (block 545), and whether there is sufficient buffering available to reprocess the data (block 550).

Where either the decoding process converged (block 545) or there is insufficient buffering available (block 550), the decoded data is de-interleaved (block 570) and stored in a buffer (block 575). The buffer includes various results that may have become available out of order, and as such the various results are reordered in the buffer to represent the order in which the corresponding data input was originally received (block 580). It is then determined if a complete time set is available in the buffer (block 585). A complete time set includes every result corresponding to received inputs over a given period of time. Thus, for example, where the first result is delayed while two later results are reported, the complete time set exists for the three results once the first result is finally available in the buffer. It should be noted that in some embodiments of the present invention that the results are reported out of order to a recipient. In such cases, there is no need to reorder results or to determine whether complete time sets are available. Where a complete time set is available (block 585) or where the results are to be reported as they are received without regard to order, the result(s) are output to a recipient (block 590).

Alternatively, where the decoding process failed to converge (block 545) and there is sufficient buffering available (block 550), the process of detection and decoding is repeated. In particular, the decoded data is de-interleaved (block 505) and the resulting de-interleaved data is stored to a buffer (block 510). The data is access from the buffer and a hard decision decoding process is performed on the accessed data (block 503). It is then determined whether the hard decision decoding process resolved the remaining errors (i.e., the process converged) in the data accessed from the buffer (block 506). Where the process does converge (block 506), the previously discussed processes of blocks 570 through 590 are repeated for the converged data.

Alternatively, where the process fails to converge (block 506), the de-interleaved data is aligned with the corresponding sample of the data input (block 515) once the data detector is available. The de-interleaved data and the corresponding sample data input is provided to the data detector where a subsequent data detection is performed (block 530) on the originally stored sample of data input (block 525) using the soft input developed in the earlier processing of the same data input (blocks 555, 560, 565, 545, 550, 505, 510, 515). The result of the data detection process is interleaved (block 535) and the interleaved data is decoded (block 540). At this point, it is determined whether the data detection and decoding process failed to converge (block 545) and is to be repeated, or whether the result converged (block 545) and is to be reported.

Figure 1:
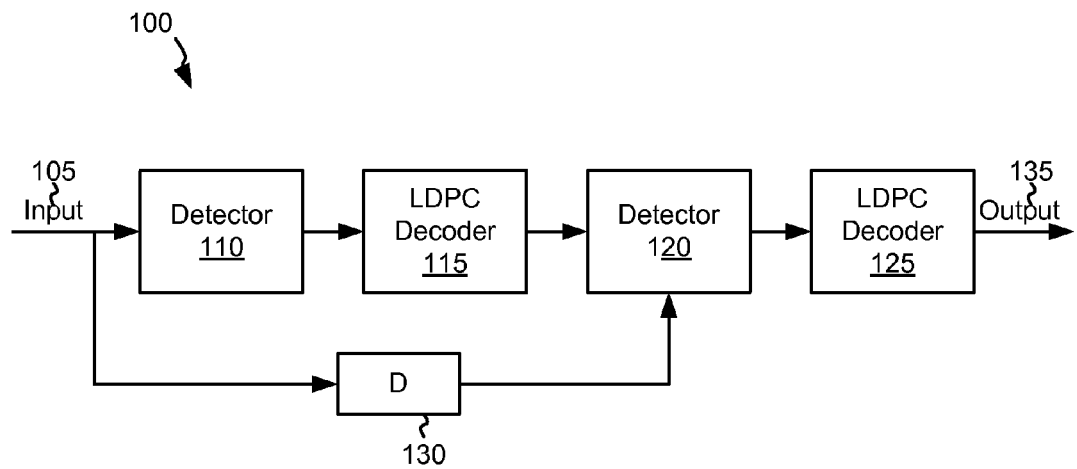
FIG. 1 depicts a prior art two stage data detection and decoding system.
Figure 6:
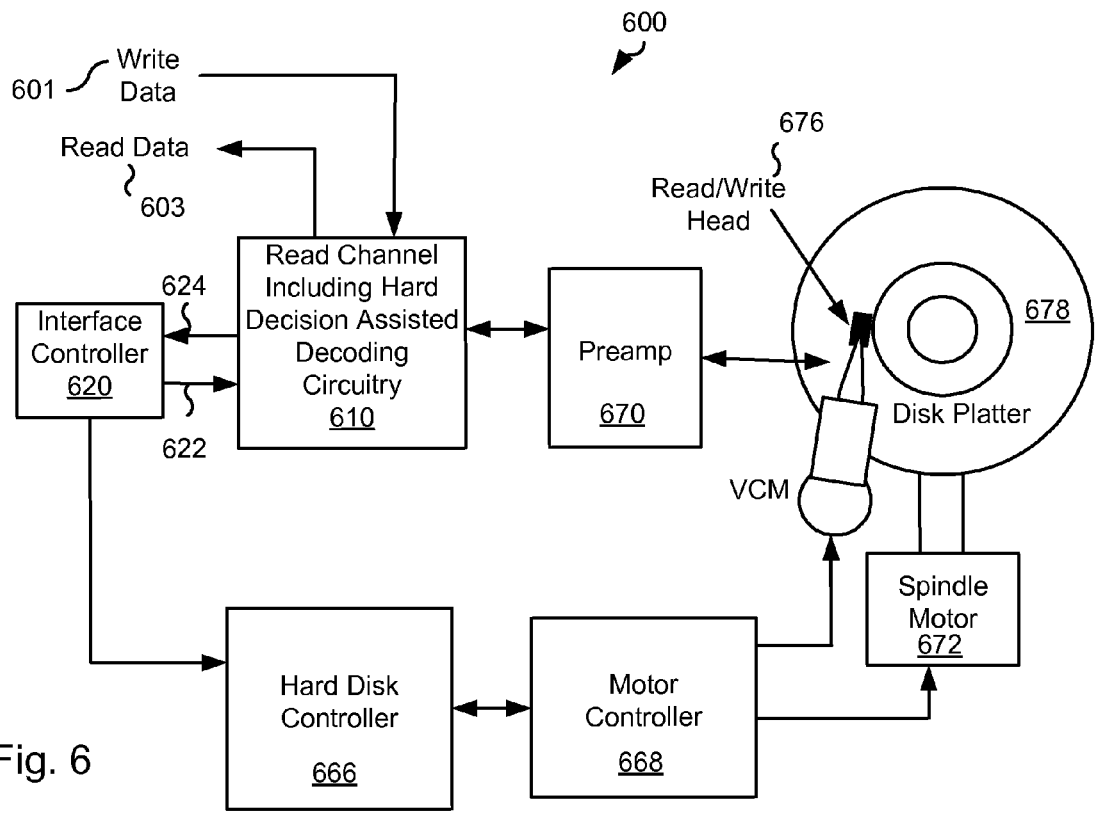
FIG. 6 shows a storage system with hard decision assisted decoding in accordance with various embodiments of the present invention.

Turning to FIG. 6, a storage system 600 including read channel 610 with hard decision assisted decoding in accordance with various embodiments of the present invention. Storage system 600 may be, for example, a hard disk drive. Read channel 610 may include, but is not limited to, a data processing codec similar to those described above in relation to FIGS. 2 through 4. In some cases, the data processing codec may operate similar to that described in relation to FIG. 5.

Storage system 600 also includes a preamplifier 670, an interface controller 620, a hard disk controller 666, a motor controller 668, a spindle motor 672, a disk platter 678, and a read/write head assembly 676. Interface controller 620 controls addressing and timing of data to/from disk platter 678. The data on disk platter 678 consists of groups of magnetic signals that may be detected by read/write head assembly 676 when the assembly is properly positioned over disk platter 678. In one embodiment, disk platter 678 includes magnetic signals recorded in accordance with a perpendicular recording scheme. For example, the magnetic signals may be recorded as either longitudinal or perpendicular recorded signals.

In a typical read operation, read/write head assembly 676 is accurately positioned by motor controller 668 over a desired data track on disk platter 678. The appropriate data track is defined by an address received via interface controller 620. Motor controller 668 both positions read/write head assembly 676 in relation to disk platter 678 and drives spindle motor 672 by moving read/write head assembly to the proper data track on disk platter 678 under the direction of hard disk controller 666. Spindle motor 672 spins disk platter 678 at a determined spin rate (RPMs). Once read/write head assembly 678 is positioned adjacent the proper data track, magnetic signals representing data on disk platter 678 are sensed by read/write head assembly 676 as disk platter 678 is rotated by spindle motor 672. The sensed magnetic signals are provided as a continuous, minute analog signal representative of the magnetic data on disk platter 678. This minute analog signal is transferred from read/write head assembly 676 to read channel 610 via preamplifier 670. Preamplifier 670 is operable to amplify the minute analog signals accessed from disk platter 678. In turn, read channel module 610 decodes and digitizes the received analog signal to recreate the information originally written to disk platter 678. The decoding process includes hard decision assist which, in some cases, may limit the amount of processing required for convergence and in other cases may allow convergence that otherwise would not be possible. The read data is provided as read data 603. A write operation is substantially the opposite of the preceding read operation with write data 601 being provided to read channel module 610. This data is then encoded and written to disk platter 678.

In conclusion, the invention provides novel systems, devices, methods and arrangements for performing data decoding and/or detection. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscribe line systems. Therefore, the above description should not be taken as limiting the scope of the invention, which is defined by the appended claims.

What is claimed is:

1. A data processing system, the system comprising:
    a processing loop circuit, wherein the processing loop circuit includes a data detector and a soft decision decoder, wherein the data detector is operable to provide a detected output, and wherein the soft decision decoder is operable to apply a soft decoding algorithm to a derivative of the detected output to yield a soft decision output and a first hard decision output;
    a queuing buffer, wherein the queuing buffer is operable to store the soft decision output and the first hard decision output;
    a hard decision decoder, wherein the hard decision decoder is operable to access the first hard decision output and to apply a hard decoding algorithm to yield a second hard decision output; and
    wherein the data detector is operable to perform a data detection on a derivative of the soft decision output if the soft decision decoder and the hard decision decoder fail to converge.

2. The data processing system of claim 1, wherein the data detector is selected from a group consisting of: a soft output Viterbi algorithm detector, and a maximum a posteriori detector.

3. The data processing system of claim 1, wherein the soft decision decoder is an LDPC decoder, and wherein the soft decoding algorithm is an LDPC algorithm.

4. The data processing system of claim 1, wherein the system further comprises:
    an output data buffer, wherein the output data buffer is operable to store the first hard decision output whenever the soft decision decoder converges.

5. The data processing system of claim 4, wherein the output data buffer is operable to store the second hard decision output whenever the hard decision decoder converges.

6. The data processing system of claim 5, wherein the output data buffer is operable to reorder the first hard decision output or the second hard decision output to place them in sequence relative to other hard decision outputs derived from either the soft decision decoder or the hard decision decoder.

7. The data processing system of claim 1, wherein the system further comprises:
    an input data buffer, wherein the input data buffer is operable to store a number of input data sets, and wherein the data detector is operable to apply a data detection algorithm to the input data set using the derivative of the soft decision output.

8. The data processing system of claim 1, wherein the processing loop circuit further includes:
    an interleaver, wherein the interleaver is operable to interleave the detected output and to provide the result as the derivative of the detected output.

9. The data processing system of claim 1, wherein the processing loop circuit further includes:
    a de-interleaver, wherein the de-interleaver is operable to de-interleave the soft decision output and to provide the result as the derivative of the soft decision output.

10. The data processing system of claim 1, wherein the system is a circuit incorporated in a device selected from a group consisting of: a storage device and a communication device.

11. The data processing system of claim 1, wherein the system is implemented as part of an integrated circuit.

12. A method for data processing, the method comprising:
    providing a processing loop circuit, wherein the processing loop circuit includes a data detector and a soft decision decoder;
    decoding a data input using the soft decision decoder to yield a first soft decision output and a first hard decision output;
    providing a hard decision decoder, wherein the hard decision decoder accesses the first hard decision output and applies a hard decoding algorithm to yield a second hard decision output;

providing the second hard decision output as a result if the second hard decision output converges;
providing a queuing buffer;
storing the first soft decision output to the queuing buffer; and
if the hard decision output fails to converge:
performing a data detection using the data detector and a derivative of the first soft decision output to yield a detected output; and
decoding a derivative of the detected output using the soft decision decoder to yield a second soft decision output.

13. The method of claim 12, wherein the method further comprises:
interleaving the detected output to yield an interleaved detected output, wherein the derivative of the detected output is the interleaved detected output.

14. The method of claim 12, wherein the method further comprises:
de-interleaving the first soft decision output to yield a de-interleaved soft decision output, wherein the derivative of the first soft decision output is the de-interleaved soft decision output.

15. The method of claim 12, wherein decoding the derivative of the detected output using the soft decision decoder yields a third hard decision output, and wherein the method further comprises:
providing the third hard decision output as the result where the third hard decision output converges.

16. The method of claim 12, wherein decoding the derivative of the detected output using the soft decision decoder yields a third hard decision output, and wherein the method further comprises:
writing the second soft decision output to the queuing buffer where the third hard decision output fails to converge.

17. The method of claim 12, wherein the method further comprises:
if the hard decision output converges:
removing first soft decision output from the queuing buffer.

18. The method of claim 12, wherein the soft decision decoder is an LDPC decoder.

19. The method of claim 12, wherein the data detector is selected from a group consisting of: a soft output Viterbi algorithm detector, and a maximum a posteriori detector.

20. The method of claim 12, wherein the data detector is a first data detector, and wherein the method further comprises:
providing second data detector;
providing a data set to the second data detector; and
performing a data detection on the data set using the second data detector to yield a detected output, and wherein the data input is a derivative of the detected output.

21. A data processing circuit, the circuit comprising:
a data detector circuit operable to apply a data detection algorithm to a data set to yield a detected output;
a first data decoder circuit operable to apply a data decode algorithm to a decoder input derived from the detected output to yield a decode output including a soft data and a first hard data;
a memory operable to store the soft data and the first hard data;
a second data decoder circuit operable to apply a hard decoding algorithm to the first hard data to yield a second hard data;
wherein the data detector circuit is further operable to apply the data detection algorithm to the data set guided by the soft data based upon a failure of the second data decoder circuit to converge; and
wherein the circuit is incorporated in a storage device, and wherein the storage device comprises:
a storage medium operable to store an information set;
a read/write head assembly disposed in relation to the storage medium and operable to generate a sensed signal corresponding to the information set;
a processing circuit including:
an analog to digital converter circuit operable to convert the sensed signal to a series of digital samples; and
an equalizer circuit operable to equalize the series of digital samples to yield the data set; and
wherein the data processing circuit is implemented as part of an integrated circuit.

22. The data processing circuit of claim 21, wherein the first data decoder circuit is a low density parity check decoder circuit, and wherein the data detector is selected from a group consisting of: a soft output Viterbi algorithm detector, and a maximum a posteriori detector.

23. The data processing circuit of claim 21, wherein the circuit further comprises:
an output data buffer operable to store the first hard data whenever the first data decoder circuit converges, and wherein the output data buffer is operable to store the second hard data whenever the second data decoder circuit converges.

24. The data processing circuit of claim 23, wherein the output data buffer is operable to reorder the first hard data or the second hard data to place them in sequence relative to other hard data derived from either the first data decoder circuit or the second data decoder circuit.

* * * * *